United States Patent [19]

Berman

[11] Patent Number: 5,071,503
[45] Date of Patent: Dec. 10, 1991

[54] METHOD AND APPARATUS FOR MAKING THREE-DIMENSIONAL OBJECTS

[75] Inventor: Michael Berman, B'nai B'rak, Israel

[73] Assignee: N.C.T. Limited, Givatayim, Israel

[21] Appl. No.: 422,273

[22] Filed: Oct. 16, 1989

[30] Foreign Application Priority Data

Dec. 7, 1988 [IL] Israel .................................. 88626

[51] Int. Cl.⁵ .............................................. B32B 31/18
[52] U.S. Cl. ................................... 156/250; 156/250; 156/264; 156/265; 156/267; 156/512; 156/516
[58] Field of Search ............... 156/58, 59, 212, 222, 156/245, 264, 265, 267, 512, 516, 250; 164/152, 219, 259, 263; 83/48, 76.1

[56] References Cited

U.S. PATENT DOCUMENTS

| | | | |
|---|---|---|---|
| 3,932,923 | 1/1976 | DiMatteo | 156/264 |
| 4,132,575 | 1/1979 | Suzuki et al. | 156/59 |
| 4,298,414 | 11/1981 | Latapie et al. | 156/59 |
| 4,359,190 | 11/1982 | Pagano | 156/222 |
| 4,385,949 | 5/1983 | Fontes | 156/59 |
| 4,474,722 | 10/1984 | Martin | 156/264 |
| 4,575,330 | 3/1986 | Hull | 156/58 |
| 4,673,453 | 6/1987 | Georgii | 156/264 |
| 4,752,352 | 6/1988 | Feygin | 156/59 |
| 4,863,663 | 9/1989 | Nico et al. | 264/152 |

*Primary Examiner*—Caleb Weston
*Attorney, Agent, or Firm*—Benjamin J. Barish

[57] ABSTRACT

A method of making a three-dimensional object constituted of a large number of layers bonded together, each having the contour of a thin slice of the object, is characterized in that each layer is precisely contoured after having been bonded to the partially-built three-dimensional object but before the next succeeding layer is bonded to it. Each layer is a preformed sheet and is bonded to the partially-built object by applying an adhesive at locations within the confines of the contour of the area of contact between the layer to be bonded and the object, such that the portions of the sheet outside of the contour of the contact area are easily separated.

27 Claims, 4 Drawing Sheets

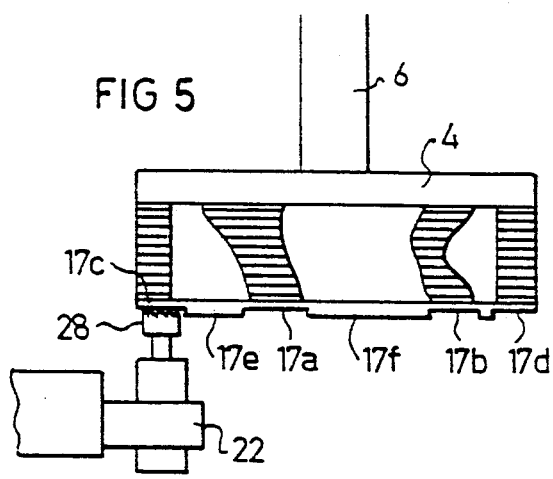
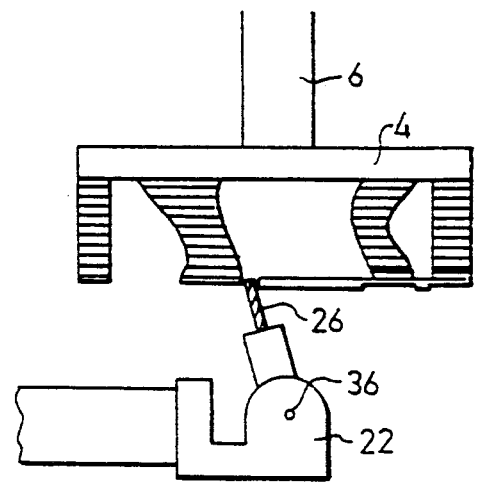
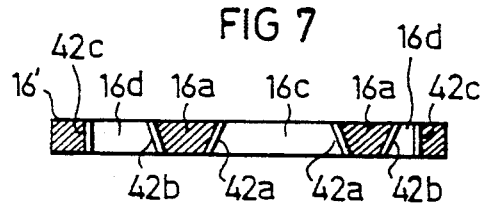
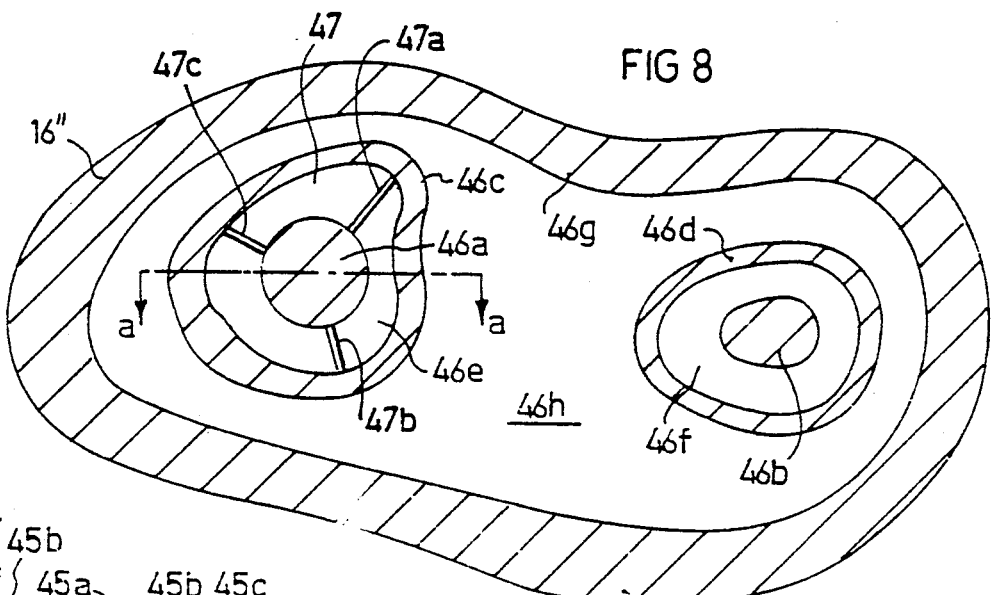
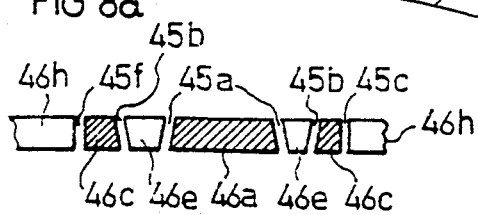

METHOD AND APPARATUS FOR MAKING THREE-DIMENSIONAL OBJECTS

BACKGROUND OF THE INVENTION

The present invention relates to a method and apparatus for making three-dimensional objects, such as models, dies, moulds, and other three-dimensional products.

The invention is particularly applicable to the technique of making three-dimensional objects constituted of a large number of relatively thin layers bonded together each having the contour of a thin slice of the object. Many such methods have been developed over the years, but they recently have become of particular interest since they may be used to facilitate the design of three-dimensional objects using CAD (computer-aided-design) techniques, or to facilitate the manufacture of three-dimensional objects using CAM (computer-aided-manufacture) techniques. In the known methods, as illustrated for example in U.S. Pat. Nos. 2,015,457, 2,335,127, 2,345,240, 3,539,410, 3,932,923, 4,132,575, 4,298,414, 4,385,949, 4,474,722, 4,673,453, and 4,752,352 the individual layers are first contoured, and then the contoured layers are stacked and bonded together to form the three-dimensional object. However, such methods are generally not very precise since they involve a registration problem between the pre-contoured layers, and take a relatively long time because the layers are generally cut with vertical walls requiring very thin layers to achieve good accuracy (to avoid a "stepped" appearance).

An object of the present invention is to provide a method and apparatus for making such three-dimensional objects which more readily lend themselves to CAD and CAM techniques and which may be used for producing three-dimensional objects with high precision and in a much shorter time than the above-mentioned existing methods.

BRIEF SUMMARY OF THE INVENTION

According to a broad aspect of the present invention, there is provided a method of making a three-dimensional object constituted of a larger number of layers bonded together each having the contour of a thin slice of the object; characterized in that each layer is bonded to a preceding layer to produce a partially-built three-dimensional object and, when at least one such layer has been bonded to the partially-built three-dimensional object, the at least one layer is precisely contoured, by removing excess material beyond its contour, before the next succeeding layer is bonded thereto. In the preferred embodiments of the invention described below, each layer is bonded to the partially-built three-dimensional object and is precisely contoured after having been so bonded but before the next succeeding layer is bonded thereto.

It will thus be seen that, whereas the previously-known methods first contoured each layer and then bonded together a plurality of such contoured layers, in the method of the present application each layer is first bonded to the partially-built three-dimensional object and is contoured after having been so bonded but before the next succeeding layer is bonded thereto. Since each layer (except the first) is precisely contoured only after it has been bonded to the partially-built three-dimensional object, the method avoids the errors stemming from registration problems, thickness of the adhesive, etc., and therefore permits a much higher degree of precision to be obtained as compared to the previously-known procedures. Moreover, the method of the present invention lends itself very well to CAD and CAM techniques.

Two embodiments of the invention are described below for purposes of example. In the first embodiment, each layer is a pre-formed sheet and is bonded to the partially-built three-dimensional object by applying an adhesive to the sheet at locations within the confines of the contour of the area of contact between the respective layer to be bonded and the object, such that the portions of the sheet outside of the contour of the contact area are not bonded to the partially-built three-dimensional object and are therefore easily separated therefrom. In the second described embodiment, each layer is applied to the preceding layer by photopolymerization. In both described embodiments, each layer, after being bonded to the object, is precisely contoured to its respective shape by a cutting operation.

According to another important feature of the invention, the cutting implement has five degrees of freedom. That is, it may be driven linearly along the three orthogonal axes, and may also be rotated about two rotary axes. Such an arrangement permits high precision to be obtained with a minimum number of layers, since each layer may be cut either vertically straight or sloped during the contour cutting operation. Thus, cutting the layer at a slope enables the use of thicker layers while avoiding a "stepped" appearance between the layers.

In both implementations of the method, the layers are preferably of different thickness, i.e., the thickness of each layer may vary according to the slope and curvature of the edges of the particular slice in the three-dimensional object to obtain the desired precision while using a minimum number of layers.

According to a further feature, a planing operation is selectively applied, e.g., after the bonding of each layer or of a plurality of layers, to the outer surface of the last layer bonded to the three-dimensional object being made. The planing operation is performed after the respective layer has been bonded to the object, but before it has been contoured, thereby maintaining the high precision in the shape of the object during its build-up by the application of the successive layers. Preferably, the planing operation is performed only in the surface areas within the contour to remain with the object, and not in the surface areas outside of the contour to be separated from the object.

In the first embodiment wherein pre-formed sheets are bonded to the object by the application of an adhesive, the adhesive applicator is preferably carried by the same tool head as carrying the cutting implement, thereby permitting the adhesive to be applied in preselected locations within the confines of the contour of the contact area of the respective layer with the object. Preferably, the adhesive is applied to the sheet to be bonded to the three-dimensional object, but it could be applied instead to the outer surface of the three-dimensional object to receive the next sheet. In either case, the adhesive is preferably applied not only within the confines of the contour of the contact area of the respective layer with the object, but also within the confines of a frame to enclose the largest contour of the object and to support the layer during the subsequent cutting operation. Such a frame thus physically supports the sheet during the cutting operation and thereby maintains the high precision in the layers as they are sucessively bonded to the three-dimensional object. In the described embodiment, this supporting frame is a continuous one completely enclosing the complete object (and contour to be cut), but it is contemplated that it could be a discontinuous one, e.g., in the form of posts periodically spaced around the contour to be cut or at the corners of the contour to be cut.

Forming the contour of any particular layer may involve a plurality of cutting operations for the respective layer. Thus, where the above-described supporting frame is provided in the first embodiment, there would be at least two cutting operations, one for the contour to be formed and one for the frame, the material between the two cuts being permitted to fall away by gravity. However, a larger number of cutting operations may be required with respect to any particular layer, e.g., when the respective slice is hollow or involves two or more elements spaced from each other. Where a plurality of cutting operations are required for any particular layer, the cutting operations are performed in the inner-to-outer direction, so that the portions of the layer to be separated from the three-dimensional object being made will drop laterally of the cutting tool, and therefore will not interfere with the cutting operations. The order of cutting also enables the outer frame to mechanically support each cut.

In the second embodiment of the invention, wherein each layer is applied by photopolymerization, its contour is also precisely cut by a cutting operation before the next succeeding layer is applied. Each layer applied by photopolymerization is formed according to the approximate contour of the respective slice in the three-dimensional object being made, and is cut by a cutting operation according to its precise contour (including slopes) in the respective slice before the succeeding layer is applied. This embodiment has advantages over know photopolymerization techniques, such as described in U.S. Pat. No. 4,575,330, in that it enables a cutting operation to be performed along five axes. This permits the edges to be cut at a slope, thereby reducing the number of layers required for a given accuracy and also reducing the complexity and cost of the optical apparatus required to produce a precise contour.

The invention also provides apparatus for making a three-dimensional object in accordance with the above method.

It will thus be seen that the method and apparatus of the present invention, as briefly described above, lend themselves extremely well to high-precision and fast designing of new three-dimensional objects by the use of CAD techniques, and also to high-precision and fast manufacturing of such objects by CAM techniques. Besides avoiding an accumulation of errors, and saving a lot of time compared to existing methods, the system may also include means for periodically measuring various dimensions of the object as it is being built-up by the various layers, and for making any necessary corrections, particularly by a planing operation, in the subsequent layers to be applied in order to compensate for any deviations in the object as it is being built up.

Further features and advantages of the invention will be apparerent from the description below.

BRIEF DESCRIPTION OF THE DRAWINGS

The invention is herein described, by way of example only, with reference to the accompanying drawings, wherein:

FIG. 5 diagrammatically illustrates a planing operation that may be selectively performed on a sheet after having been bonded to the object but before the sheet is cut according to its precise contour;

FIG. 6 diagrammatically illustrates the cutting operation when using the apparatus of FIG. 1;

FIG. 7 is a sectional view illustrating sloped cuts which may be made when contouring the sheet in order to enable the use of thicker sheets without imparting a "stepped" appearance to the object;

FIG. 8 illustrates an example of a contour to be cut in a sheet after having been bonded to the object, FIG. 8a being a sectional view along line a—a;

DESCRIPTION OF PREFERRED EMBODIMENTS

The Embodiment of FIGS. 1-8

The apparatus illustrated in FIGS. 1-8 uses preformed self-supporting sheets for building up the three-dimensional object. Briefly, each sheet is first bonded to the partially-built three-dimensional object, and is contoured after having been so bonded but before the next succeeding sheet is bonded thereto. Each sheet is bonded by applying an adhesive at locations within the confines of the contour of the area of contact of the respective sheet with the object, such that the portions outside of the contour of the contact area are not bonded to the partially-built object and therefore easily separate therefrom during the contouring operation performed by a cutting implement.

Figure 1:
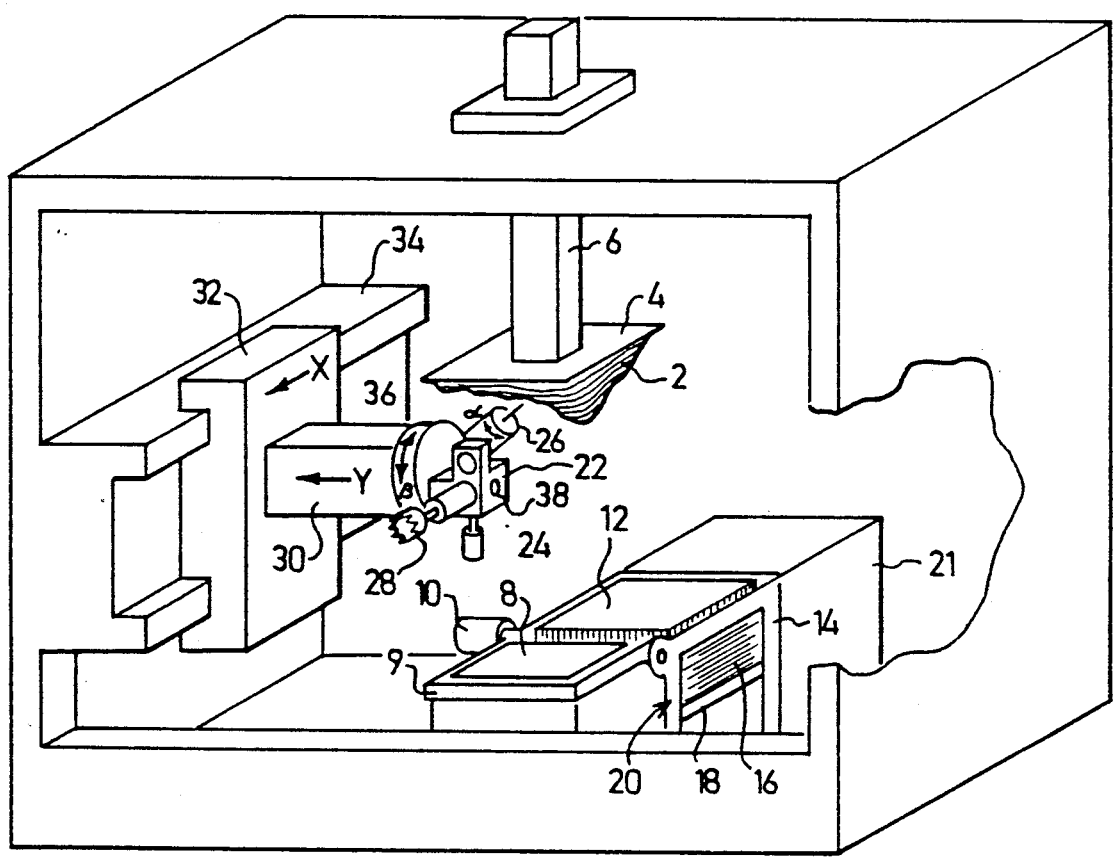
FIG. 1 diagrammatically illustrates one form of apparatus constructed in accordance with the present invention.

More particularly, the three-dimensional object being made, generally designated 2 in FIG. 1, is supported by a base plate 4 carried at the lower end of a bar 6 which may be raised or lowered to bring the object 2 towards or away from a pick-up plate 8 supported on a table 9 at a bonding station. Pick-up plate 8 is pivotal by a motor 10 to either its operative position illustrated in FIG. 1 over table 9 and in alignment with base plate 4, or to a loading position to overly an opening 12 in a holder 14 for holding a stack of pre-formed sheets 16 supported on a platform 18 disposed within a magazine 20 and urged by a spring (not shown) towards opening 12. The apparatus preferably includes a plurality of magazines each for holding a stack of sheets of the same thickness, the thickness being different for the different magazines. FIG. 1 only illustrates two magazines 20, 21, but it will be appreciated that there preferably would be more, e.g., 4 or 5. The magazines are selectively positioned with respect to pick-up plate 8 in any suitable manner, e.g., by a piston.

Pick-up plate 8 is of the suction type and includes a plurality of nozzles applying suction to the topmost sheet on platform 18 of the selected magazine when the plate is in its loading position overlying opening 12, so as to pick-up the topmost sheet and to pivot it over table 9 and in approximate alignment with base plate 4.

The apparatus illustrated in FIG. 1 further includes a movable head 22 carrying three implements, namely: an adhesive applicator 24, a cutting tool 26, and a planing tool 28. Head 22 is carried by a supporting member 30 slidable within a block 32, which block is in turn slidable on a channel member 34. Thus, head 22 may be moved along the X-axis by the sliding of block 32 on channel 34, and along the Y-axis by the sliding of supporting member 30 with respect to block 32. The Z-axis of movement of head 22 with respect to the three-dimensional object being made and mounted on base plate 4, is effected by the raising and lowering movements of bar 6 to which the base plate is secured.

In addition to the above-described three orthogonal axes of movement of the cutting tool 26 with respect to the three-dimensional object 2, the cutting tool is also movable about two rotary axes; that is, it is rotatable to a selected angle "α" about axis 36, and to a selected angle "β" about axis 38. It will thus be seen that five degrees of freedom are provided between the cutting tool 26 and the three-dimensional object 2, namely along the three orthogonal axes, X, Y and Z, and along the two rotary axes "α" and "β". The adhesive applicator 24 and the planing tool 28 are movable along the same axes of movement of the cutting tool 26, except about the "α" axis 36.

Figure 2:
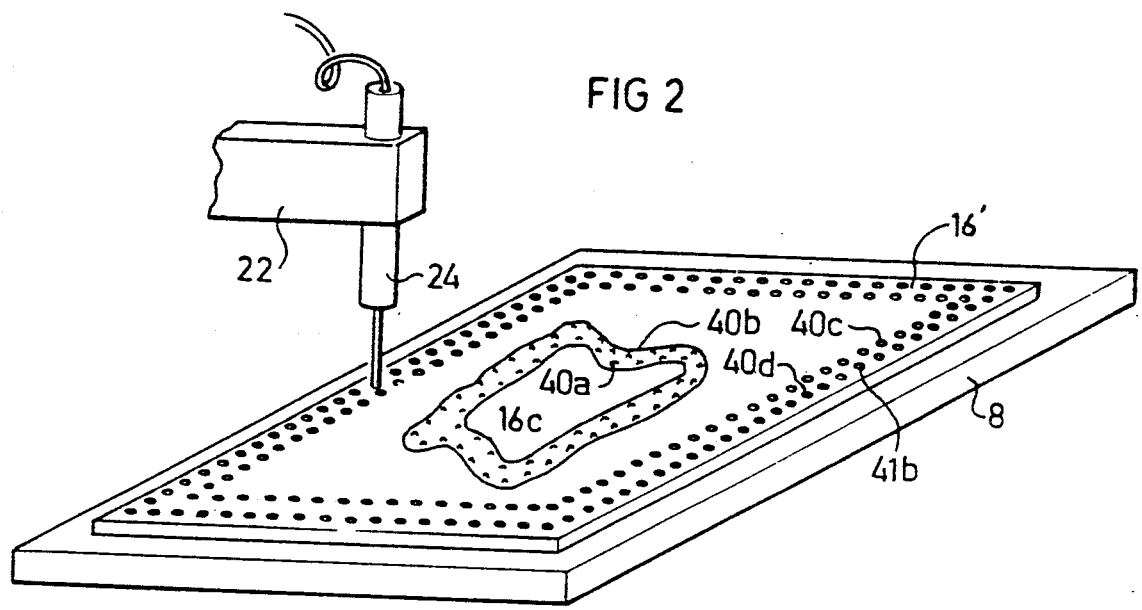
FIG. 2 illustrates the adhesive applicator in the apparatus of FIG. 1 for applying the adhesive to each sheet before the sheet is bonded to the three-dimensional object being made.
Figure 3:
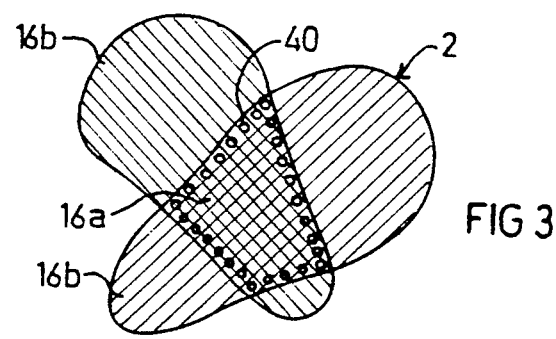
FIG. 3 illustrates one pattern of beads of adhesive applied by the applicator of FIG. 2.

The apparatus illustrated in FIG. 1 is used for making the three-dimensional object 2 from a plurality of the sheets 16 by first bonding a sheet to the object, and then cutting the sheet according to the precise contour in its respective slice of the object; that is, each sheet is contoured after it has been bonded to the object but before the next succeeding sheet is bonded thereto. The illustrated apparatus is used to perform these operations as illustrates in FIGS. 2–6, as follows:

First, the apparatus is used for performing an adhesive-applying operation as illustrated in FIGS. 2 and 3. For this purpose, the sheet 16' picked-up from the stack of sheets 16 on platform 18 by the pick-up plate 8, is held in the bonding station on table 9 in alignment with base plate 4 carrying the three-dimensional object 2 being made. When in the bonding station, the adhesive applicator 24 carried by head 22 is used for applying spots or beads of adhesive 40 to the sheet 16' of the pick-up plate 8. As shown in FIG. 3, the adhesive is applied at locations to define bond lines within the confines of the contour of the contact area between the respective sheet and the three-dimensional object being made, such that the portion 16a of the sheet within the confines of the desired contour will be bonded to the three-dimensional object 2, whereas the portions 16b of the sheet not bonded to the object may easily be separated from it. In the arrangement illustrated in FIG. 1, the three-dimehsional object is supported in a vertical position, with each layer being bonded to the bottom surface of the object; thus, after the cutting operation, the non-bonded portion 16b of the sheet separates from the bonded portion 16a by gravity.

FIG. 2, however, illustrates the adhesive 40 being applied not along a single bond line as shown in FIG. 3, but rather along four bond lines, 40a–40d. The two innermost bond lines 40a, 40b define the actual contour 41a of the respective slice in the three-dimensional object represented by that sheet; bond line 40a is slightly within the inner contour surface, and bond line 40b is slightly within the outer contour surface. Accordingly, after the contour surfaces have been cut by the cutting tool 26, it will be seen that the inner non-bonded portion 16c will drop out.

The two outer bond lines 40c, 40d define a continuous frame 41b enclosing the contour of the respective layer as defined by bond lines 40a, 40b. The adhesive applied along bond lines 40c, 40d thus retains the remainder of the sheet intact to mechanically support the sheet while its contour is being cut, particularly when cutting the external contour along bond line 40b. Thus, when cutting the external contour along bond line 40b, portion 16d of the sheet will remain intact and will not separate until the cutting tool actually cuts the sheet along bond line 40c, or rather, slightly outwardly of that bond line. At that time, the non-bonded portion 16d of the sheet will drop, leaving only the desired contour between the bond lines 40a, 40b, enclosed within a rectangular frame secured by the bond lines 40c, 40d.

Figure 4:
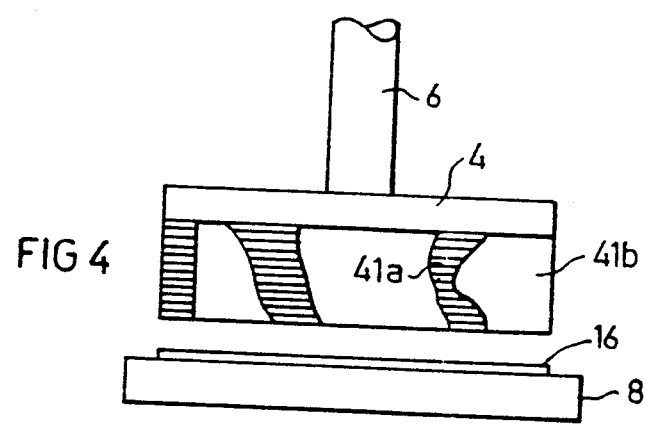
FIG. 4 diagrammatically illustrates the bonding operation when using the apparatus of FIG. 1 for bonding a sheet to the three-dimensional object being made.

FIG. 4 illustrates the bonding operation wherein the sheet 16', after receiving the adhesive along the above-described bond lines 40a–40d from the adhesive applicator 24, is pressed into firm contact with the underside of the three-dimensional object 2 being made. For this purpose, the object is moved downwardly (along the Z-axis) by bar 6 until its bottom surface, namely the sheet bonded thereto during the previous operation, engages the sheet 16' now to be applied.

After the bonding operation illustrated in FIG. 4 has been completed, the apparatus may perform a planing operation as illustrated in FIG. 5. Planing tool 28 is used for this purpose and is applied to plane the outer surface of the just-bonded layer 16'. Preferably, the planing tool 28 is applied only to the bottom surfaces 17a, 17b within the contour (defined by the bond lines 40a, 40b, FIG. 2) in the three-dimensional object being made, and also to the bottom surface 17c, 17d within the frame (defined by bond lines 40c, 40d, FIG. 2) to enclose the three-dimensional object being made, and not to the non-bonded portions 17e, 17f, 17g of the sheet to be separated as a result of the cutting operations to be subsequently performed.

The planing operation illustrated in FIG. 5 may be applied to each sheet, after it has been bonded to the three-dimensional object, or after a plurality of sheets have been so bonded, according to the desired precision in making the object. In any case, since the planing operation is performed after the respective sheet has been bonded to the object and before the cutting operation, a high degree of precision in making the object can be attained.

FIG. 6 illustrates the cutting operation itself which, as described earlier, is performed after the respective sheet 16' has been bonded to the three-dimensional object 2, and after the planing operation illustrated in FIG. 5. if such operation is performed with respect to that particular sheet. As also described earlier, the cutting tool 26 in the cutting operation may be positioned with respect to the object 2 along three orthogonal axes (X, Y, Z) and also along two rotary axes of movement, namely to a selected angle "α" about axis 36, and to a selected angle "β" about axis 38.

In the example illustrated in FIG. 2, three cutting operations are performed in sheet 16', namely along cutting lines 42a, 42b and 42c. These cutting operations are performed from the inner-to-outer direction. Thus, the first cutting operation is performed along contour 42a, slightly inwardly of the innermost contour 40a (FIG. 2), so that when that operation is completed, the center portion 16c of the sheet will drop by gravity; next a cutting operation is performed along contour 42b, slightly outwardly of contour 40b; and finally a cutting operation is performed along contour 42c, slightly inwardly of bond contour 40c, the completion of which causes portion 16d of the sheet to drop out by gravity. In this manner, the portion of the sheet to be dropped is always laterally of the cutting tool 26, and therefore its dropping cannot interfere with the subsequent cutting operations. Also, the mechanical support provided by the outer frame is preserved to the end of the cutting operations for the respective layer.

The fact that the cutting tool 26 is rotatable to a selected angle "α" about axis 36 and to a selected angle "β" about axis 38, enables the cutting tool to cut either along a vertical surface bordering the contour or along a sloped surface. This is more particularly illustrated in FIG. 7, wherein it will be seen that cutting contours 42a, 42b produces sloped edges around the layers, whereas cutting along contour 42c produces straight walls (edges). Cutting contour 42c determines the frame around the contoured slice, and therefore it is preferably straight so as to produce a continuous flush surface for the frame. However, cutting contours 42a, 42b determine the contour of the respective slice, and frequently it may be necessary to cut them at a slope. This enables thicker sheets 16 to be used, saving a lot of time while minimizing the "stepped" appearance that would be produced. Accordingly, this feature enables almost an order of magnitude reduction in the number of sheets, and thereby in the overall production time, for producing a three-dimensional object of specified precision, compared to existing methods.

FIG. 8 illustrates a more complicated contour that may be present in a slice of the three-dimensional object being made. Thus, the respective sheet, also designated 16' in FIG. 8, includes two sections 46a, 46b each enclosed by a spaced annular section 46c, 46d, to constitute a part of the three-dimensional object being made. The sheet further includes an annular section 46e between contour sections 46a, 46c, and another annular 46f, between contours 46b and 46d; annular sections 46e, 46f are to drop out after the cutting operation. In addition, the sheet includes an outer frame section 46g to enclose, and thereby to physically strengthen, the contour sections during the cutting operation as described above. The remaining section 46h, between the frame section 46g and the outermost contour sections 46c, 46d, is to drop-out as a result of the cutting operations.

As also described above, the cutting operations are performed from the inner-to-outer direction. In this case wherein there are two "inner" contour sections, the cutting operations would first be performed along contours 45a and 45b, wherein section 46c would drop-out, and then along contours 45d and 45e, wherein section 46f would drop-out, then along contours 45c and 45f, and finally along contour 45g wherein section 46h would drop-out.

As shown in FIG. 8a, illustrating a section along lines a—a of FIG. 8, cutting along contour 45c, determining the outer face of the annular contour section 46c, produces a vertical edge. However, cutting contours 45a and 45b, determining the outer surface of the inner contour section 46a and the inner surface of the outer contour section 46b, have to be sloped. This is done by appropriately adjusting angles "α" and "β" of the cutting tool 26 (FIG. 6), in order to permit thicker sheets to be used as described above. In this case, the slopes of cutting lines 45a, 45b are "negative", i.e., the drop-out section 46e will not normally drop-out by gravity as a result of the cutting operation. However, this section may be caused to "drop-out" by merely applying additional cuts 47a-47c across the drop-out section 45e, as shown in FIG. 8.

The overall operation of the system illustrated in FIGS. 1-8 will be apparent from the above description. Thus, a magazine 20, 21 containing the sheets of the desired thickness is first selected and moved into position with respect to the pick-up plate 8. A sheet 16 is then picked-up by suction plate 8 and is pivoted to bring the plate over table 9 in alignment with the supporting plate 4. The movable head 22 is then driven to cause adhesive applicator 24 to apply spots of adhesive along the bond lines 40a-40d, within the confines of the contour of the area of contact of the respective sheet with the three-dimensional object being made, and also within the confines of the outer frame 41b, as illustrated in FIG. 2. The sheet is then bonded to the bottom of the three-dimensional object carried by supporting base 4 by a bonding operation as illustrated in FIG. 4, and may then be planed flat by a planing operation as illustrated in FIG. 5. The cutting operation, as illustrated in FIG. 6, is then performed, whereupon the non-bonded sections 16c and 16d fall-out, leaving only the bonded contour section 41a and its outer frame 41bb.

The above-described operations for applying one layer are repeated for each layer, until the build-up of the three-dimensional object has been completed.

It will be appreciated that all the foregoing operations can be pre-programmed and controlled by conventional CAD and CAM utilizing CNC (computerized numerical control) techniques. In addition, sensors can be provided to sense any deviation in the actual Z-axis dimension from the desired one, which deviations can be corrected by the appropriate application of the planing tool 28.

As described above, mounting the cutting tool 26 for rotation about axis 36 and axis 38 (FIG. 6), enabling it to cut the sheet at any desired slope, permits the use of thicker sheets, which reduces the overall manufacturing time, as described above. For purposes of example, to achieve a resolution (accuracy) of 0.1 mm in the existing methods, each sheet would have a thickness of 0.1 mm, and the three-dimensional object may be constituted of the order of many hundreds of such sheets. According to the present invention, the thickness of each sheet depends only on the smallest profile (silhouette) radius of the edge surfaces of the slice and the desired accuracy and will on average, in many practical cases, be of the order of 1 mm or more, thus reducing production time by about an order of magnitude. In most cases, the sheets used will have a thickness of 0.25 mm to 4.00 mm.

Figure 9:
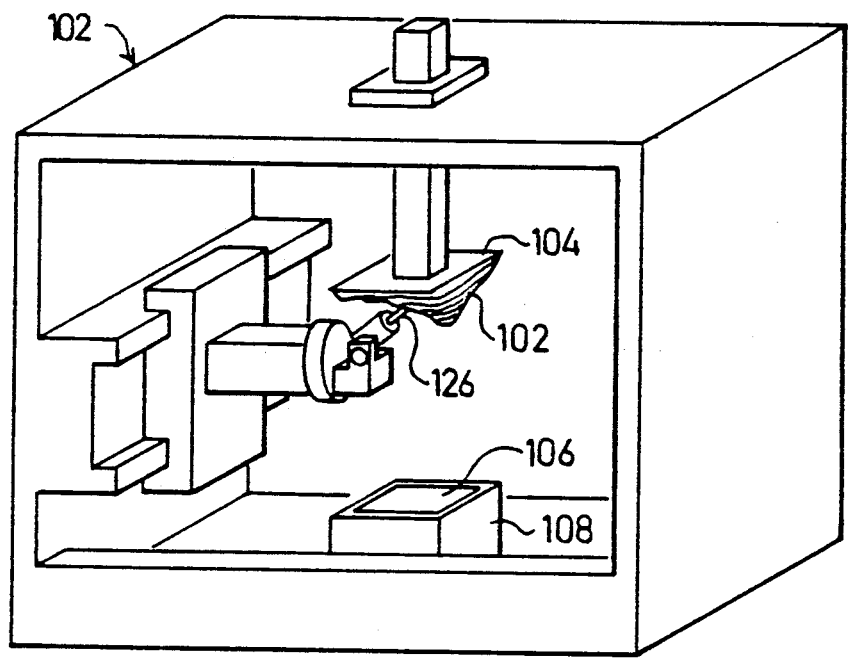
FIG. 9 diagrammatically illustrates another form of apparatus constructed in accordance with the invention, this apparatus applying each layer to the object being built-up by photopolymerization.
Figure 10:
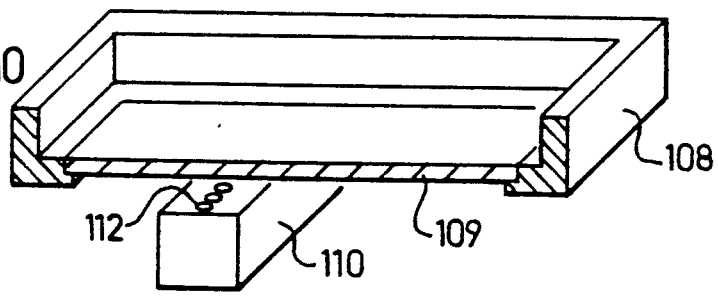
FIG. 10 illustrates the radiant-energy producing means in the apparatus of FIG. 9 for photopolymerizing the material applied as a layer to the object.
Figure 11:
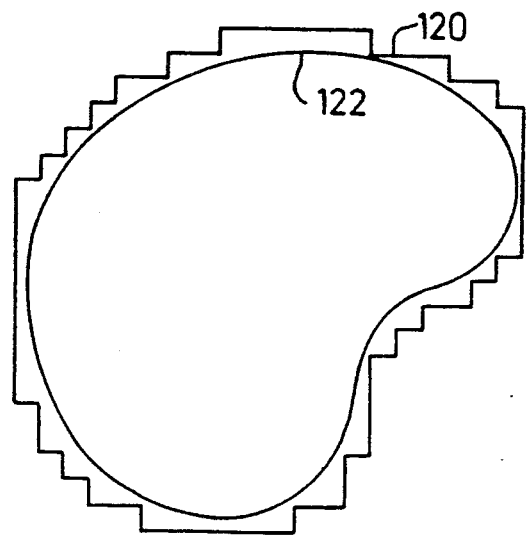
FIG. 11 diagrammatically illustrates the approximate contour in which the photopolymerized material is originally formed on the object, and before the approximate contour is cut to its precise contour by a cutting operation.

The Embodiment of FIGS. 9–11

FIGS. 9–11 illustrate a second embodiment of the invention wherein each layer is formed and applied to the three-dimensional object being made by photopolymerization, rather than being preformed and applied by adhesive as in the embodiment of FIGS. 1–8. However, as in the embodiment of FIGS. 1–8, the embodiment of FIGS. 9–11 also performs a precise (generally sloped) contouring of each layer by a cutting operation after the layer has been applied to the three-dimensional object, and before the next succeeding layer is applied.

In the apparatus illustrated in FIG. 9, the three-dimensional object being built, generally designated 102, is also supported by a plate 104. The supporting plate 104 is lowered towards a liquid bath of photopolymerizable material 106 contained within a reservoir 108 having a bottom transparent plate 109 (FIG. 10). The object being built is immersed in the bath 106 so as to be spaced from the bottom transparent plate 109 a distance which is equal to the exact thickness of the next slice. This thickness of polymerizable material is subjected to infrared radiation by the radiation device 110 (FIG. 10), which is moved across the underside of the transparent plate 109 so as to polymerize the layer of material between the object 102 being formed and the bottom transparent plate 109.

As shown in FIG. 10, radiation device 110 includes a line of infrared light sources 112 extending along one orthogonal axis (e.g., the X-axis), and the device is moved along a second orthogonal axis (e.g., the Y-axis). Thus, the complete surface of the film of polymerizable material between the lower surface of the three-dimensional object being formed and the glass plate 109 may be subjected to infrared radiation. In this case, however, the infrared light sources 112 are selectively energized to polymerize this layer of material 106 according to the approximate contour, rather than according to the exact contour, of the respective slice in the three-dimensional object 102 being made; and after the approximate contour has thus been formed, the cutting tool 126, which corresponds to cutting tool 26 in FIG. 1, is used to cut the precise contour at the correct slopes.

The approximate, or coarse, contour produced by the selective energization of the infrared elements 112 of the radiation device 110 may be as illustrated in FIG. 11, wherein it will be seen that a stepped, rather than a continuous, contour 120 is produced. The cutting tool 126 is then applied to produce the precise and smooth contour 122 with the necessary slopes by cutting away the excess material.

It will be appreciated that the method as illustrated in FIGS. 9–11 does not require the build-up of the outer frame, as in the method described above with respect to the apparatus of FIGS. 1–8. It will also be appreciated that the method of FIGS. 9–11 minimizes the quantity of photopolymerizable material necessary, since it polymerizes only sufficient material to produce the approximate contour, and then removes whatever material is necessary in order to produce the precise contour. In the other respects, the method of FIGS. 9–11 provides the same basic advantages as the method described above with respect to FIGS. 1–8.

While the invention has been described with respect to two preferred embodiments, it will be appreciated that many variations, modifications and other applications of the invention may be made.

What is claimed is:

1. A method of making a three-dimensional object constituted of a large number of layers bonded together each having the contour of a thin slice of the three-dimensional object; characterized in that each layer is bonded to the preceding layer to produce a partially-built three-dimensional object and, when at least one such layer has been bonded to the partially-built three-dimensional object, said at least one layer is precisely contoured, by a cutting operation, before the next succeeding layer is bonded thereto.

2. The method according to claim 1, wherein each layer is a pre-formed sheet and is bonded to the partially-built three-dimensional object by applying an adhesive at locations within the confines of the contour of the area of contact between the respective layer to be bonded and the object, such that the portions of the sheet outside of the contour of the contact area are not bonded to the partially-built three-dimensional object and are therefore easily separated therefrom.

3. The method according to claim 2, wherein the partially-built three-dimensional object is supported in a vertical position, and each sheet is bonded to the bottom thereof such that, after the respective bonded sheet is contoured the non-bonded portion thereof is separated with the aid of gravity from the bonded portion.

4. The method according to claim 1, wherein said adhesive is also applied within the confines of a frame enclosing the largest contour of the object, which frame physically supports the sheet during the subsequent cutting operation, the portion of the respective sheet between said frame and the contour being separated by the cutting operation.

5. The method according to claim 4, wherein the cutting operations cut some contours to define vertically straight edges, and other cut contours to define sloping edges.

6. The method according to claim 4, wherein said frame is continuous.

7. The method according to claim 4, wherein said frame is interrupted and defines a series of posts around said contour.

8. The method according to claim 4, wherein the thin slice of the three-dimensional object corresponding to the sheet being bonded has an inner contoured face and an outer contoured face, said adhesive being applied on the respective sheet along an inner bond line slightly inwardly of the inner contour face of the respective slice, and along an outer bond line slightly inwardly of the outer contour face of the respective slice.

9. The method according to claim 4, wherein the cutting operations for each sheet are performed with respect to bond lines in the inner-to-outer direction, starting with the innermost bond line and ending with the outermost bond line.

10. The method according to claim 1, wherein a flat planing operation is selectively applied to the outer surface of the last layer bonded to the three-dimensional object being made.

11. The method according to claim 10, wherein said planing operation is performed before the contouring operation and only on the portions of the layer within the contour.

12. The method according to claim 1, wherein each layer is applied to the preceding layer by photopolymerization, and its contour is precisely cut by a cutting operation before the next succeeding layer is applied.

13. The method according to claim 12, wherein each layer is applied by photopolymerization to the approximate contour of the respective slice in the three-dimensional object being made, and is cut by a cutting operation according to its precise contour in the respective slice before the next succeeding layer is applied.

14. Apparatus for making a three-dimensional object constituted of a large number of thin layers bonded together each having the contour of a thin slice of the object, comprising:

a supporting member for supporting the object being made;

a layer-applying means for applying and bonding each layer to the partially-built three-dimensional objects as it is being made; and contouring means for removing excess material form each layer beyond its contour after at least one of said layers has been applied and bonded to produce a partially-built three-dimensional object and before the next succeeding layer is applied and bonded thereto.

15. The apparatus according to claim 14, wherein said layer-applying means comprises:

a sheet holder for holding a stack of preformed sheets each to constitute one of said layers;

sheet feeding means for feeding individual sheets to a bonding station;

an adhesive applicator at said bonding station for applying adhesive to each of said sheets at locations within the confines of the contour of the area of contact between the respective layer to be bonded and the object;

and means for effecting relative movement between each sheet after the adhesive has been applied to it, and the partially-built three-dimensional object supported on said supporting member, to bond said sheet to the three-dimensional object.

16. The apparatus according to claim 15, wherein there are a plurality of sheet holders, for holding sheets of different thickness to be selectively fed by said sheet feeding means to said bonding station.

17. The apparatus according to claim 15, wherein said cutting means comprises a cutting implement for cutting each sheet along the contour of the respective sheet after bonding same to the three-dimensional object and before bonding the next succeeding sheet thereto.

18. The apparatus according to claim 17, wherein said cutting implement is mounted on a movable head which includes a drive for selectively driving the cutting implement along three orthogonal axes, and two rotary axes.

19. The apparatus according to claim 18, wherein said movable head also carries a planer element for selectively planing the outer surface of the last layer bonded to the partially-built three-dimensional object being made.

20. The apparatus according to claim 18, wherein said movable head also carries said adhesive applicator for applying adhesive to each of said sheets at locations within the confines of the contour of the contact area of the respective sheet to be bonded with the object, such that the portion of the respective sheet outside of the contour of the contact area is not bonded to the partially-built three- dimensional object and is therefore easily separatable therefrom.

21. The apparatus according to claim 15, wherein said sheet feeding means comprises a suction-type pick-up plate for picking-up individual sheets from the sheet holder.

22. The apparatus according to claim 14, wherein said layer-applying means for applying and bonding each layer of the three-dimensional object being made comprises:

a reservoir for containing a liquid bath of a photopolymerizable material;

and photo-energy producing means effective to photopolymerize said material to form a plurality of layers in succession on said three-dimensional object, each layer being so formed after the preceding layer has been precisely contoured by said cutting means.

23. The apparatus according to claim 22, wherein said photo-energy producing means is effective to photopolymerize each layer on the partially-built three-dimensional object in a form corresponding to the approximate contour of the respective slice in the three-dimensional object, said cutting means being effective to cut each layer according to the precise contour of the respective slice in the three-dimensional object before the next layer is applied thereto.

24. The apparatus according to claim 23, wherein said photo-energy producing means comprises a plurality of infrared light sources arranged in a line along one orthogonal axis, and means for moving said line of infrared light sources along a second orthogonal axis.

25. The apparatus according to claim 14, wherein said cutting means comprises a cutting implement for cutting each layer along its contour after bonding same to the partially-built three-dimensional object and before bonding the next succeeding layer thereto.

26. The apparatus according to claim 25, wherein said movable head also carries a planer element for selectively planing the outer surface of the last layer bonded to the three-dimensional object being made.

27. The apparatus according to claim 25, wherein said cutting implement is mounted on a movable head which includes a drive for selectively driving the cutting implement along three orthogonal axes and about two rotary axes.

* * * * *